(12) United States Patent
Yen et al.

(10) Patent No.: US 12,368,073 B2
(45) Date of Patent: Jul. 22, 2025

(54) SEMICONDUCTOR DEVICE HAVING AIR GAP AND METHOD FOR MANUFACTURING THE SAME

(71) Applicant: TAIWAN SEMICONDUCTOR MANUFACTURING COMPANY, LTD., Hsinchu (TW)

(72) Inventors: Hung-Yu Yen, Hsinchu (TW); Keng-Chu Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 531 days.

(21) Appl. No.: 17/842,548

(22) Filed: Jun. 16, 2022

(65) Prior Publication Data

US 2023/0411209 A1  Dec. 21, 2023

(51) Int. Cl.
*H01L 21/768* (2006.01)
*H01L 23/522* (2006.01)

(52) U.S. Cl.
CPC .... *H01L 21/7682* (2013.01); *H01L 21/76802* (2013.01); *H01L 21/76826* (2013.01); *H01L 23/5226* (2013.01)

(58) Field of Classification Search
CPC ........... H01L 21/7682; H01L 21/76802; H01L 21/76826; H01L 23/5226; H01L 21/76834; H01L 23/5222; H01L 23/53295
See application file for complete search history.

(56) References Cited

U.S. PATENT DOCUMENTS

2015/0228531 A1*  8/2015  Tagami ............ H01L 21/76834
                                                    438/618
2016/0307773 A1* 10/2016  Lee .................... H01L 21/31116

\* cited by examiner

*Primary Examiner* — Suberr L Chi
*Assistant Examiner* — William C. Trice, III
(74) *Attorney, Agent, or Firm* — Birch, Stewart, Kolasch & Birch, LLP

(57) ABSTRACT

A method for manufacturing a semiconductor device includes: forming a patterned mask on a patterned structure disposed on a substrate, such that a first mask portion and a second mask portion of the patterned mask are disposed on a first interconnect feature and a second interconnect feature of the patterned structure, respectively; and subjecting the patterned mask to a plasma treatment process such that the first and second mask portions are deformed to form a capping portion to cap a recess disposed between the first and second interconnect features so as to form an air gap.

20 Claims, 9 Drawing Sheets

SEMICONDUCTOR DEVICE HAVING AIR GAP AND METHOD FOR MANUFACTURING THE SAME

BACKGROUND

The integration density of various electronic components, such as transistors, diodes, resistors, capacitors, etc., is being improved continuously in the semiconductor industry by continual reduction in minimum feature sizes. As the feature sizes are decreased, the distance between metal features is continually reduced. As the distance between the metal features reduces, the resulting parasitic capacitance between the metal features increases, leading to higher power consumption and larger resistance-capacitance (RC) time delays for an integrated chip. To improve performance and reduce the parasitic capacitance between the metal features, materials having low dielectric (k) values are used. However, such dielectric materials encounter a lot of processing problems that prevent further improvement of the dielectric constant.

In recent years, research on the use of air gaps in semiconductor devices to enhance the isolation of the metal features has been conducted in advanced process applications of semiconductor fabrication. Since air has the lowest k value (k=1), a growing trend has been to incorporate air gaps into the semiconductor devices so as to isolate the metal features and reduce line-to-line capacitance and the RC time delay.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
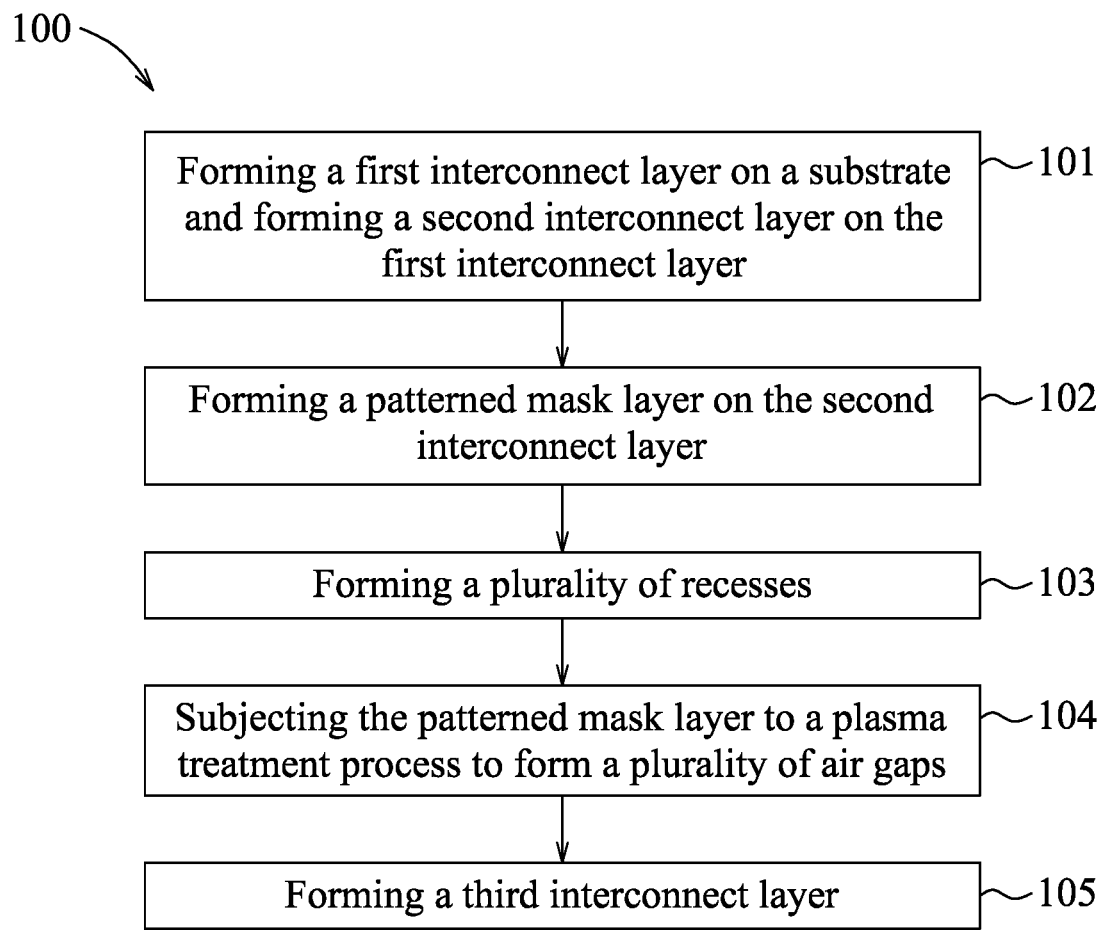
FIG. 1 is a flow diagram illustrating a method for manufacturing a semiconductor device in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "below," "above," "upwardly," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to a method for manufacturing a semiconductor device having air gaps, which are formed among conductive features (for example, but not limited to, metal lines of a metal layer), by a plasma treatment process. FIG. 1 illustrates a method 100 for manufacturing a semiconductor device in accordance with some embodiments. FIGS. 2 to 7 are schematic views of a semiconductor device 200 at some intermediate stages of the manufacturing method as depicted in FIG. 1 in accordance with some embodiments. Additional steps can be provided before, after or during the method 100, and some of the steps described herein may be replaced by other steps or be eliminated. Similarly, further additional features may be present in the semiconductor device 200, and/or features present may be replaced or eliminated in additional embodiments.

Figure 2:
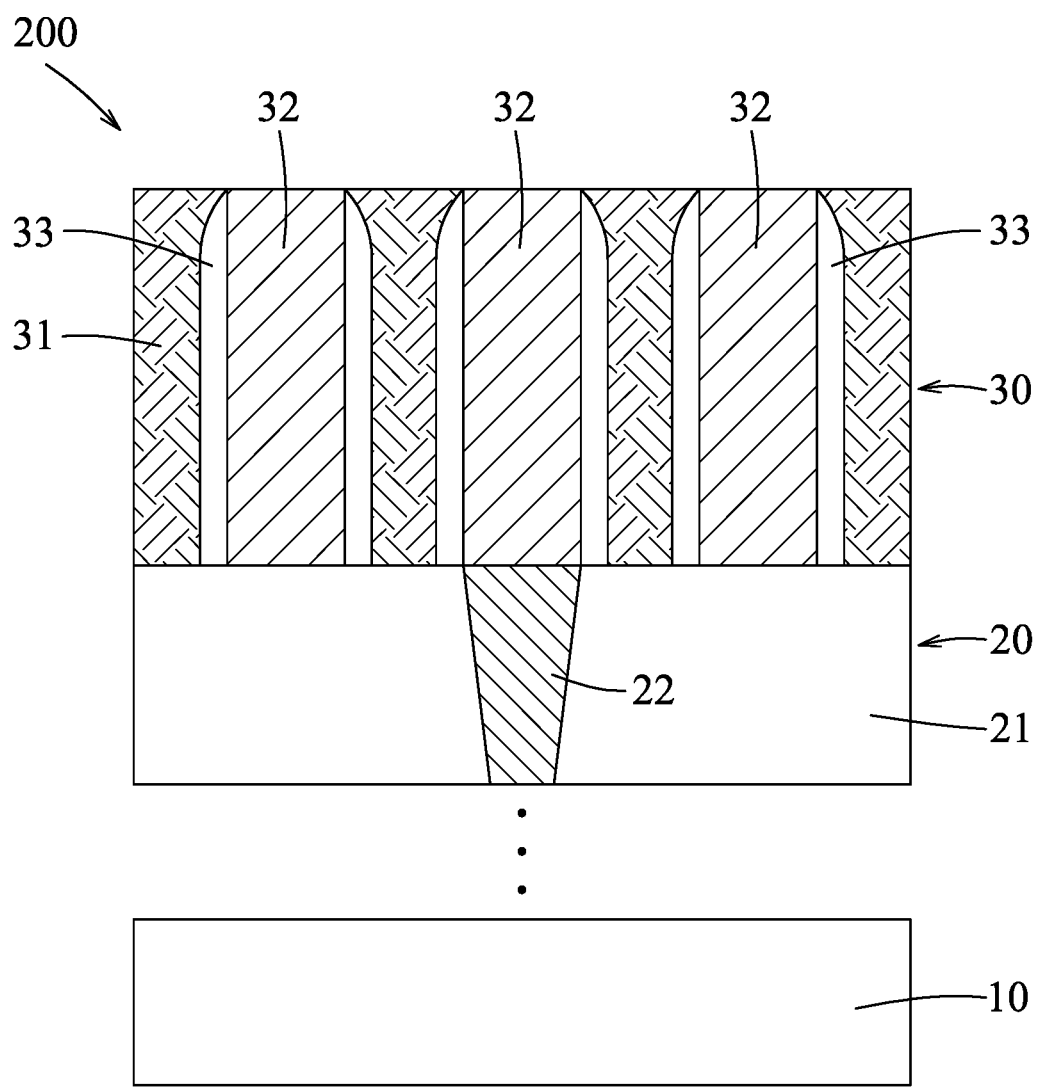
FIGS. 2 to 7 are schematic views illustrating some intermediate stages of the manufacturing method as depicted in FIG. 1 in accordance with some embodiments.

Referring to FIG. 1 and the example illustrated in FIG. 2, the method 100 begins at step 101, where a first interconnect layer is formed on a substrate and a second interconnect layer is formed on the first interconnect layer. FIG. 2 is a schematic view illustrating formation of a first interconnect layer 20 on a substrate 10 and formation of a second interconnect layer 30 on the first interconnect layer 20. In some embodiments, the first interconnect layer 20 and the second interconnect layer 30 may be formed separately and sequentially using two single damascene processes. In some embodiments, the first interconnect layer 20 and the second interconnect layer 30 may be formed at the same time using a dual damascene process.

In some embodiments, the substrate 10 is a semiconductor substrate which may include, for example, but not limited to, an elemental semiconductor or a compound semiconductor. An elemental semiconductor includes a single species of atoms, such as silicon (Si) or germanium (Ge) in column XIV of the periodic table, and may be in crystal, polycrystalline, or an amorphous form. Other suitable materials are within the contemplated scope of the present disclosure. A compound semiconductor includes two or more elements, and examples thereof may include, but not limited to, silicon carbide (SiC), gallium arsenide (GaAs), gallium phosphide (GaP), indium phosphide (InP), indium arsenide (InAs), indium antimonide (InSb), silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), and gallium indium arsenide phosphide (GaInAsP). Other suitable materials are within the contemplated scope of the present disclosure. The compound semiconductor may have a gradient feature in which the compositional ratio thereof changes from one location to another location therein. The compound semiconductor may be formed over a silicon substrate. The compound semiconductor may be strained. In some embodiments, the semiconductor substrate may include a multilayer compound semiconductor structure. In some embodiments, the semiconductor substrate may be a semiconductor on insulator (SOI) (e.g., silicon germanium on insulator (SGOI)). Generally, an SOI substrate includes a layer of a semiconductor material such as epitaxial silicon, germanium, silicon germanium, or combinations thereof. Other suitable materials are within the contemplated scope of the present disclosure. The SOI substrate may be doped with a P-type dopant, for example, but not limited to, boron (Br), aluminum (Al), or gallium (Ga). Other suitable materials are within the contemplated scope of the present disclosure. Alternatively, the SOI substrate may be doped with an N-type dopant, for example, but not limited to, nitrogen (N), phosphorus (P), or arsenic (As). Other suitable materials are within the contemplated scope of the present disclosure. In some embodiments, the semiconductor substrate may further include various active regions, for example, the active regions configured for an N-type metal oxide semiconductor transistor device (NMOS) or the active regions configured for a P-type metal oxide semiconductor transistor device (PMOS). In some embodiments, the active regions may includes source/drain (S/D) regions of a transistor device. It is noted that each of the source/drain regions may refer to a source or a drain, individually or collectively dependent upon the context.

In some embodiments, the first interconnect layer 20 is formed on the substrate 10, and includes a first inter-layer dielectric (ILD) layer 21 and a first interconnect feature 22 formed in the first ILD layer 21. The first ILD layer 21 may include a dielectric material, for example, but not limited to, silicon oxide (SiOx), silicon nitride (SiNx), silicon carbide (SiCx), silicon oxycarbide (SiOxCy), silicon oxynitride (SiOxNy), hydrogenated silicon oxycarbide (SiOxCyHz), spin-on glass (SOG), amorphous fluorinated carbon, fluorinated silica glass (FSG), Xerogel, Aerogel, polyimide, Parylene, BCB (bis-benzocyclobutenes), Flare, SiLK (Dow Chemical Co., Midland, Mich.), non-porous materials, porous materials, other low-k dielectric materials, or combinations thereof. Other suitable materials are within the contemplated scope of the present disclosure. In some embodiments, the first interconnect feature 22 may include a bulk metal region (not shown) and a liner layer (not shown) disposed to separate the bulk metal region from the first ILD layer 21. In some embodiments, the liner layer may include, for example, but not limited to, cobalt (Co), ruthenium (Ru), tantalum (Ta), or the like, suitable for forming a metal liner layer. Other suitable metal materials are within the contemplated scope of the present disclosure. In some embodiments, the bulk metal region may include, for example, but not limited to, silver (Ag), gold (Au), aluminum (Al), nickel (Ni), cobalt (Co), ruthenium (Ru), iridium (Ir), platinum (Pt), palladium (Pd), osmium (Os), tungsten (W), molybdenum (Mo), tantalum (Ta), or the like, or alloys thereof possessing promising conductive properties. Other suitable metal materials are within the contemplated scope of the present disclosure. In some embodiments, the first interconnect layer 20 may serve as a via layer disposed on the substrate 10 and the first interconnect feature 22 may serve as a conductive via contact to be electrically connected to, for example, a corresponding one of the source/drain (S/D) regions included in the substrate 10. In some embodiments, the first interconnect layer 20 may serve as a via layer disposed on a metal layer and the first interconnect feature 22 may serve as a conductive via contact to be electrically connected to a corresponding one of a plurality of metal lines of the metal layer disposed below the first interconnect layer 20 and above the substrate 10.

In some embodiments, the second interconnect layer 30 is formed on the first interconnect layer 20, and includes a second ILD layer 31, a plurality of second interconnect features 32 formed in the second ILD layer 31 and spaced apart from each other, and a plurality of spacers 33 disposed on and extending upwardly from the first interconnect layer 20 such that each of the second interconnect features 32 is laterally covered by a corresponding one of the spacers 33. The first interconnect feature 22 in the first interconnect layer 20 is electrically connected to a corresponding one of the second interconnect features 32. In some embodiments, the second interconnect layer 30 may serve as a metal layer and the second interconnect features 32 may sever as metal lines. Examples of the material for the second ILD layer 31 may be the same as or similar to those of the material for the first ILD layer 21 described above, and the details thereof are omitted for the sake of brevity. In some embodiments, each of the second interconnect features 32 may include a bulk metal region (not shown) and a liner layer (not shown) disposed to separate the bulk metal region from a corresponding one of the spacers 33. Examples of the material for the bulk metal region of each of the second interconnect features 32 may be the same as or similar to those of the material for the bulk metal region of the first interconnect feature 22 described above, and the details thereof are omitted for the sake of brevity. Examples of the material for the liner layer of each of the second interconnect features 32 may be the same as or similar to those of the material for the liner layer of the first interconnect feature 22 described above, and the details thereof are omitted for the sake of brevity. In some embodiments, the spacers 33 may include, for example, but not limited to, a low-k dielectric material, examples of which may include, for example, but not limited to, silicon oxide, silicon nitride, silicon carbide, silicon oxycarbide, silicon oxynitride, silicon carbonitride, silicon oxycarbonitride, and combinations thereof. Other suitable metal materials are within the contemplated scope of the present disclosure. In some embodiments, the spacers 33 may be omitted.

Figure 3:
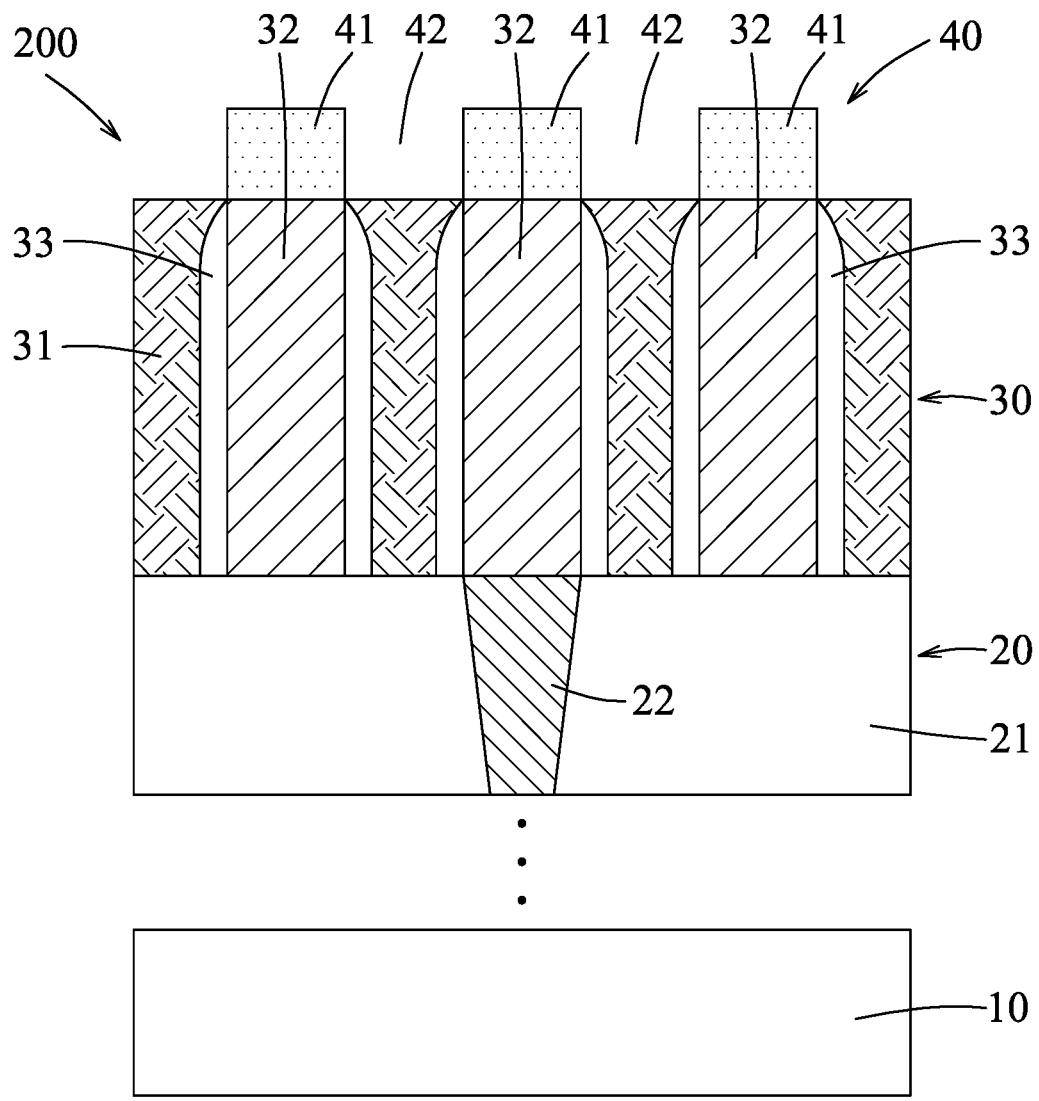

Referring to FIG. 1 and the example illustrated in FIG. 3, the method 100 proceeds to step 102, where a patterned mask layer is formed on the second interconnect layer. FIG. 3 is a schematic view illustrating formation of a patterned mask layer 40 on the second interconnect layer 30 such that a plurality of mask portions 41 are disposed on the second interconnect features 32, respectively, to define a plurality of openings 42 among the mask portions 41. In some embodiments, the patterned mask layer 40 may include, for example, but not limited to, silicon oxide, silicon nitride, silicon carbide, silicon oxycarbide, silicon oxynitride, silicon carbonitride, silicon oxycarbonitride, tungsten nitride, tungsten carbide, titanium nitride, zirconium oxide, aluminum oxide, yttrium oxide, aluminum oxynitride, hafnium oxide, hafnium zirconium oxide, hafnium silicon oxide, hafnium silicon oxynitride, zirconium silicon oxide, hafnium zirconium silicon oxide, hafnium aluminum oxide, hafnium aluminum nitride, zirconium aluminum oxide, ytterbium oxide, or combinations thereof. Other suitable materials are within the contemplated scope of the present disclosure.

In some embodiments, the patterned mask layer 40 may be selectively formed on the second interconnect features 32 by a suitable selective deposition process as is known to those skilled in the art of semiconductor fabrication, for example, but no limited to, selective chemical vapor deposition (CVD), selective atomic layer deposition (ALD), selective electroless deposition (ELD), or the like. Other suitable techniques are within the contemplated scope of the present disclosure.

In some embodiments, the patterned mask layer 40 may be formed on the second interconnect features 32 by the following steps. A mask layer (for example, a hard mask layer, not shown) is deposited on the second interconnect layer 30. The mask layer may include, for example, but not limited to, silicon oxide, silicon nitride, silicon carbide, silicon oxycarbide, silicon oxynitride, silicon carbonitride, silicon oxycarbonitride, tungsten nitride, tungsten carbide, titanium nitride, zirconium oxide, aluminum oxide, yttrium oxide, aluminum oxynitride, hafnium oxide, hafnium zirconium oxide, hafnium silicon oxide, hafnium silicon oxynitride, zirconium silicon oxide, hafnium zirconium silicon oxide, hafnium aluminum oxide, hafnium aluminum nitride, zirconium aluminum oxide, ytterbium oxide, or combinations thereof. Other suitable materials are within the contemplated scope of the present disclosure. The mask layer may be formed on the second interconnect layer 30 by a suitable deposition process as is known in the art of semiconductor fabrication, for example, but not limited to, physical vapor deposition (PVD), CVD, ALD, plasma-enhanced ALD (PEALD), thermal ALD, plasma-enhanced CVD (PECVD), or the like. Other suitable techniques are within the contemplated scope of the present disclosure. A photoresist layer (not shown) is then formed on the mask layer by a suitable fabrication technique known to those skilled in the art of semiconductor fabrication, for example, but not limited to, a spin-on technique. Other suitable techniques are within the contemplated scope of the present disclosure. The photoresist layer is then patterned using a suitable photolithography technique to form an opening pattern. For example, the photoresist layer is exposed to light for patterning, followed by developing to form the opening pattern. The opening pattern formed in the photoresist layer is transferred to the mask layer using an etching processes, for example, but not limited to, a wet etching process, a dry etching process, a reactive ion etching process, a neutral beam etching process, or the like to form the patterned mask layer 40. After the opening pattern is transferred to the mask layer to form the patterned mask layer 40, the photoresist layer may be removed by, for example, but not limited to, an ashing process.

Figure 4:
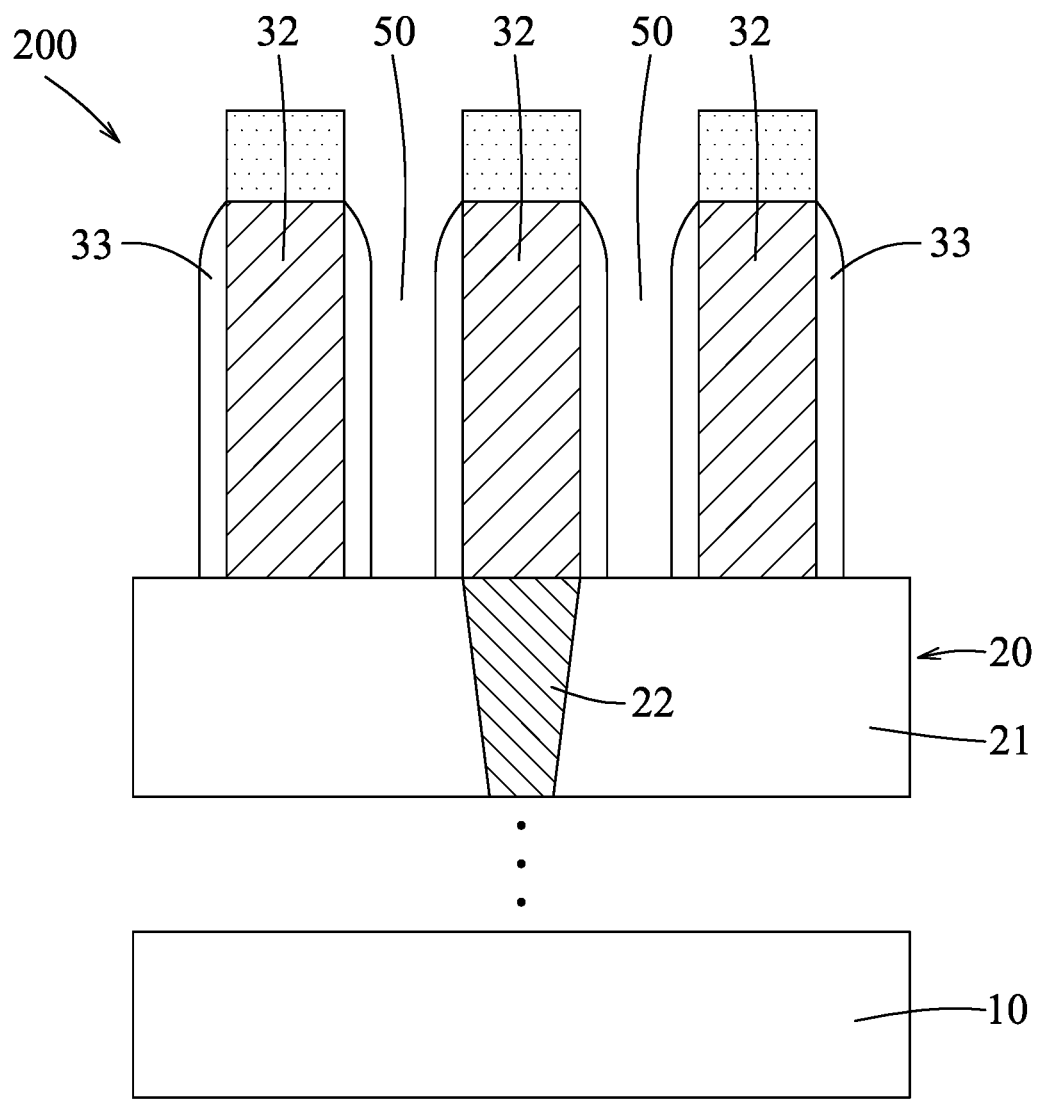

Referring to FIG. 1 and the examples illustrated in FIGS. 3 and 4, the method 100 proceeds to step 103, where a plurality of recesses are formed. FIG. 4 is a schematic view illustrating formation of a plurality of recesses 50 among the spacers 33. In some embodiments, the recesses 50 may be formed by removing the second ILD layer 31 through the openings 42 using a suitable etching process, for example, but not limited to, a wet etching process, a dry etching process, or the like. Other suitable etching techniques are within the contemplated scope of the present disclosure. In some embodiments, the recesses 50 may be formed among the second interconnect features 32 by removing the spacers 33 together with the second ILD layer 31 using a suitable etching process, for example, but not limited to, a wet etching process, a dry etching process, or the like.

Figure 5:
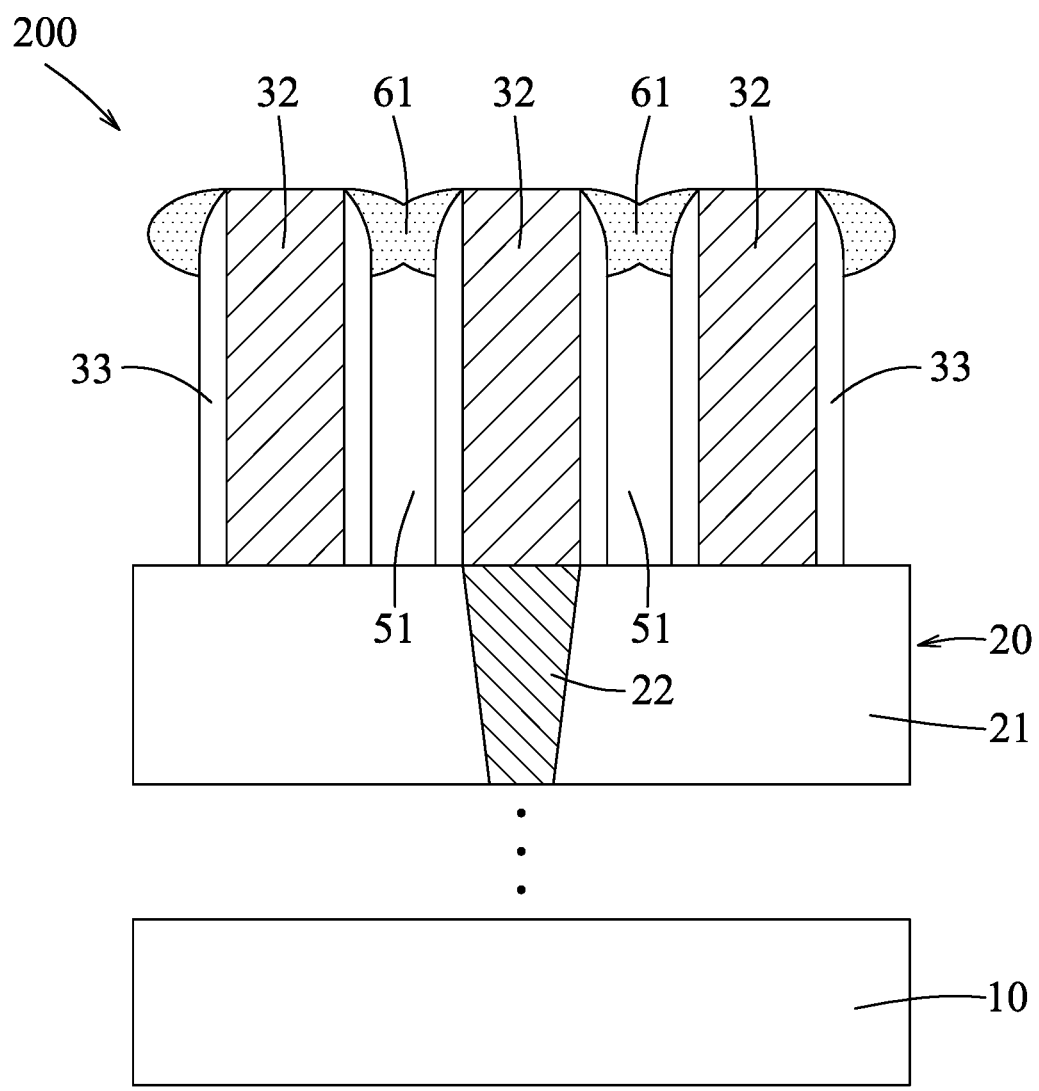
Figure 6:
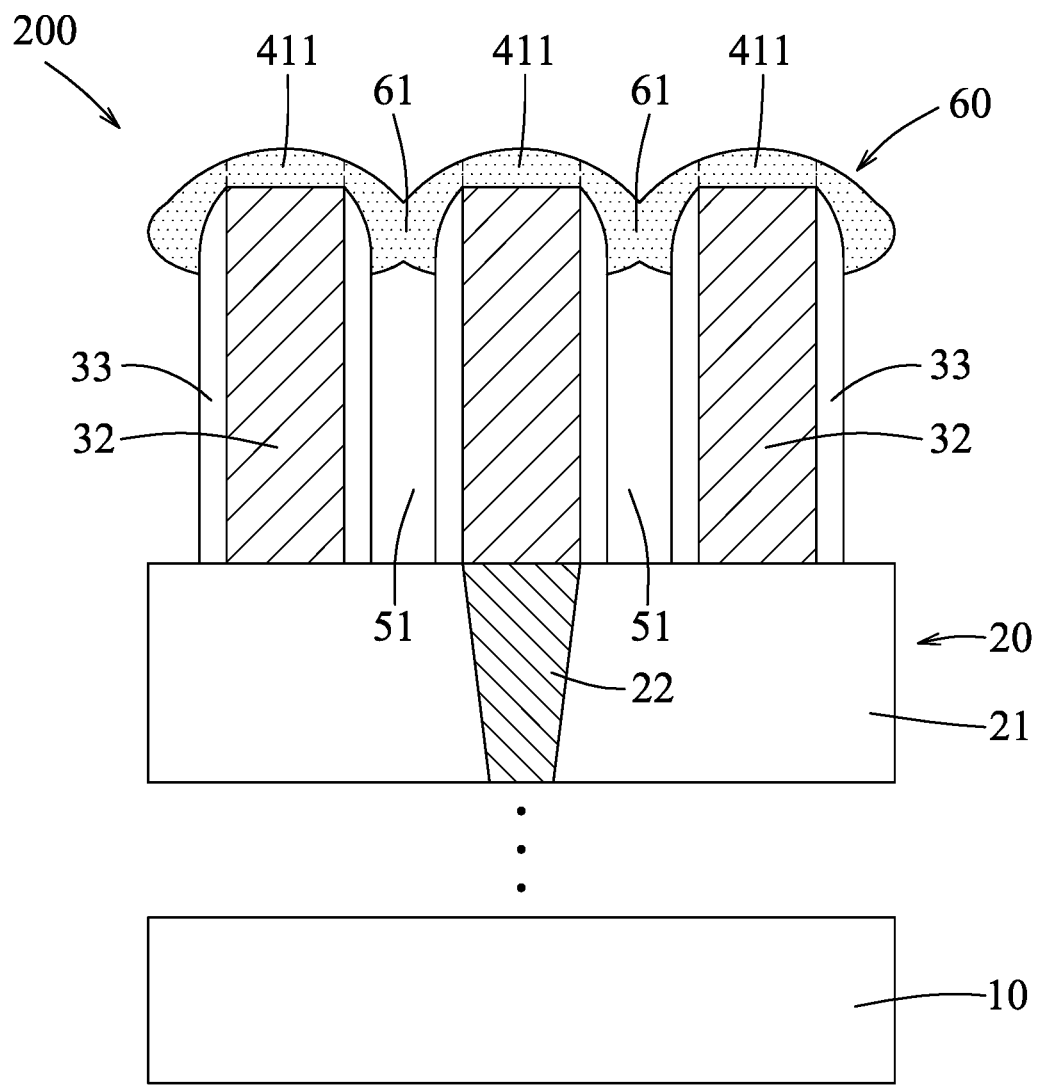

Referring to FIG. 1 and the examples illustrated in FIGS. 4 and 5, the method 100 proceeds to step 104, where the patterned mask layer is subjected to a plasma treatment process to form a plurality of air gaps. FIG. 5 is a schematic view illustrating formation of a plurality of air gaps 51 among the spacers 33. In some embodiments, the air gaps 51 may be formed among the second interconnect features 32 when the spacers 33 are not formed or are removed in the previous stages. The hard mask portions 41 are deformed by a plasma treatment process to form a plurality of capping portions 61, such that the recesses 50 are capped by the capping portions 61, respectively, to form a plurality of air gaps 51. Each of the air gaps 51 is confined by two corresponding ones of the spacers 33 and a corresponding one of the capping portions 61. Referring to the example illustrated in FIG. 6, in some embodiments, the hard mask portions 41 are deformed by the plasma treatment process such that parts of the hard mask portions 41 are deformed into the capping portions 61 that are integrated with remaining parts of the hard mask portions 411 which remain on the second interconnect features 32 to form a capping layer 60. The capping portions 61 have a thickness which is determined on the basis of a critical dimension (i.e., a width) of the air gaps 51 to be formed. In some embodiments, the air gaps 51 have a width ranging from about 5 nanometers (nm) to about 100 nm and the capping portions 61 have a thickness ranging from about 5 nm to about 100 nm. In some embodiments, the air gaps 51 have a width ranging from about 17 nm to about 40 nm and the capping portions 61 have a thickness ranging from about 5 nm to about 20 nm.

In some embodiments, the plasma treatment process to form the air gaps 51 may be conducted using a suitable plasma treatment process, for example, but not limited to, an inductively coupled plasma (ICP) process, a capacitively coupled plasma (CCP) process, a microwave (MW) plasma process, or the like. Other suitable plasma treatment processes are within the contemplated scope of the present disclosure.

In some embodiments, the plasma treatment process may be conducted for a time period ranging from about 10 seconds (sec) to about 999 sec. If the plasma treatment process is conducted for a time period less than 10 sec, the capping portions 61 for capping the recesses 50 to form the air gaps 51 cannot be formed successfully. In some embodiments, the time period for conducting the plasma treatment process may range from about 61 sec to about 999 sec. In some embodiments, the time period for conducting the plasma treatment process may range from about 301 sec to about 999 sec.

In some embodiments, the plasma treatment process may be conducted at a plasma bias power ranging from about 10 W to about 999 W. If the plasma treatment process is conducted at a plasma bias power less than 10 W, the hard mask portions 41 would not be deformed successfully to form the capping portions 61 for capping the recesses 50, and thus the air gaps 51 cannot be formed accordingly. If the plasma treatment process is conducted at a plasma bias power greater than 999 W, the capping portions 61 thus formed would be damaged. The time period for conducting the plasma treatment process can be decreased when a relatively high plasma bias power is used. In some embodiments, the plasma treatment process may be conducted at a plasma bias power ranging from about 101 W to about 999 W. In some embodiments, the plasma treatment process may be conducted at a plasma bias power ranging from about 101 W to about 300 W.

In some embodiments, the gas source for generating the plasma ions and/or radicals for conducting the plasma treatment process may include, for example, but not limited to, nitrogen ($N_2$), argon (Ar), helium (He), oxygen ($O_2$), or combinations thereof. Other suitable gases are within the contemplated scope of the present disclosure.

In some embodiments, the power for dissociating the gas source into plasma ions and/or radicals for conducting the plasma treatment process may range from about 0.5 kW to about 3 kW. If the gas source is dissociated at a power less than 0.5 kW, the plasma ions and/or radicals for conducting the plasma treatment process would not be generated effectively.

In some embodiments, the plasma treatment process may be conducted at a plasma pressure ranging from about 10 mT (milli-Torr) to about 100 T. If the plasma treatment process is conducted at a plasma pressure less than 10 mT, the density of the plasma ions and/or radicals for conducting the plasma treatment process would be too high and the capping portions 61 thus formed would be damaged. If the plasma treatment process is conducted at a plasma pressure greater than 100 T, the density of the plasma ions and/or radicals for conducting the plasma treatment process would be too low and the hard mask portions 41 would not be deformed successfully to form the capping portions 61 for capping the recesses 50, and thus the air gaps 51 cannot be formed accordingly.

In some embodiments, the plasma treatment process may be conducted at a temperature ranging from about 100° C. to about 600° C. In some embodiments, the plasma treatment process may be conducted at a temperature ranging from about 350° C. to about 600° C.

Figure 8:
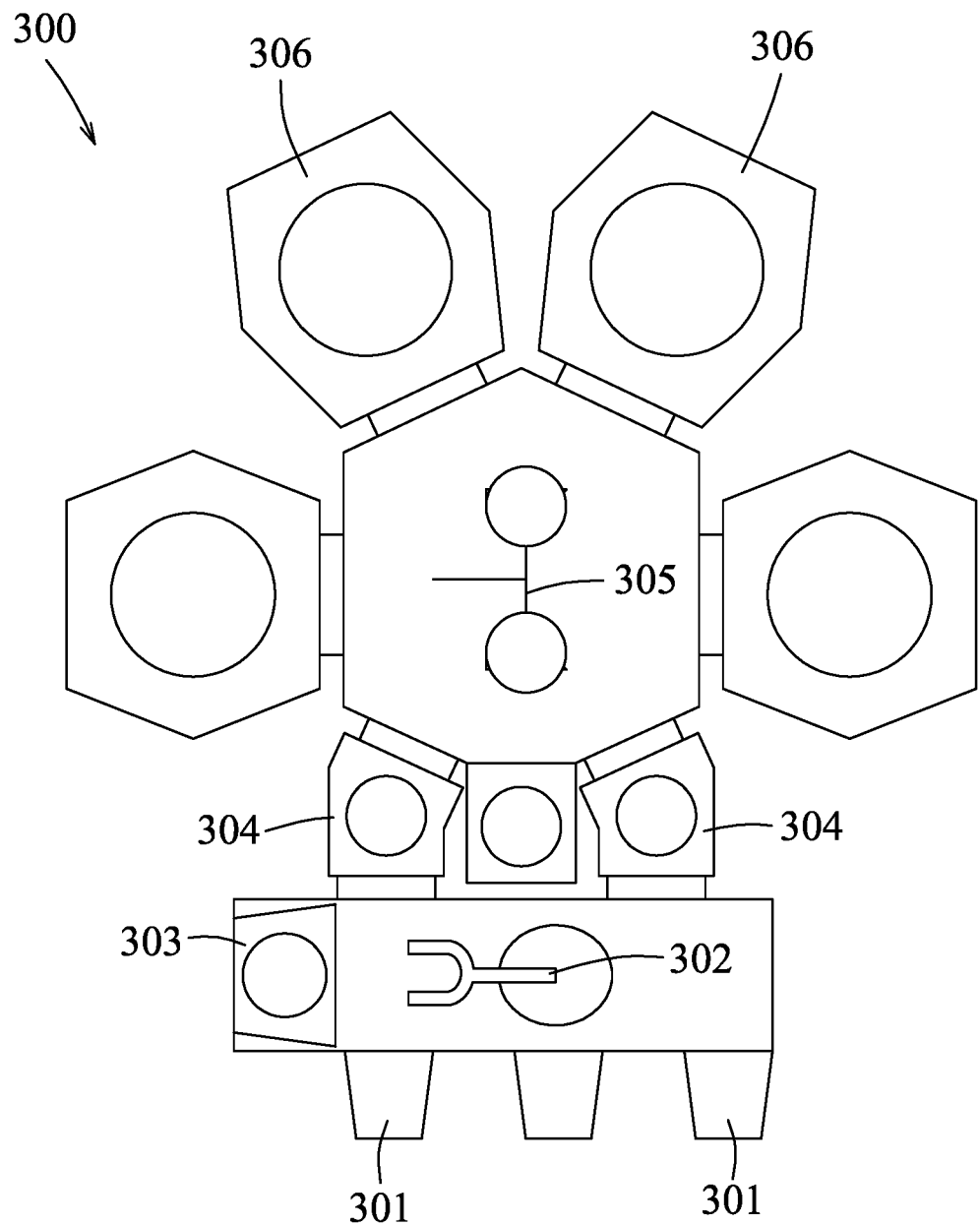
FIG. 8 is a schematic view illustrating a plasma processing system used in the manufacturing method as depicted in FIG. 1 in accordance with some embodiments.

FIG. 8 is a schematic view illustrating a plasma processing system for conducting the plasma treatment process in the manufacturing method 100 in accordance with some embodiments. A plasma processing system 300 includes a plurality of load ports 301, a first wafer transfer unit 302, a wafer orienter 303, a plurality of load lock modules 304, a second wafer transfer unit 305, and a plurality of chambers 306.

Each of the load ports 301 is configured to receive a FOUP (Front Opening Unified Pod), which is a container with a highly clean environment for accommodating semiconductor wafers therein. The plasma processing system 300 illustrated in FIG. 8. includes three of the load ports 301. However, it should be noted that any number of the load ports 301 can be included in the plasma processing system 300.

The first wafer transfer unit 302 is configured to pick-up and place the semiconductor wafers so as to transport the semiconductor wafers among the load ports 301, the wafer orienter 303, and the load lock modules 304. In some embodiments, the first wafer transfer unit 302 may be configured as a robotic arm. However, it should be noted that the first wafer transfer unit 302 may include any suitable mechanism or device for transferring the semiconductor wafers.

The wafer orienter 303 is configured to orient the semiconductor wafers before the semiconductor wafers are subjected the plasma treatment process in the chambers 306. It should be noted that in some embodiments, more than one of the wafer orienter 303 may be included in the plasma processing system 30.

The load lock modules 304 are configured to create an atmosphere compatible with that of the chambers 306. In some embodiments, the load lock modules 304 and the chambers 306 are maintained at a pressure below an atmospheric pressure, while the remaining areas (for example, the load ports 301 and the wafer orienter 303) are maintained at the atmospheric pressure. Each of the load lock modules 304 may be configured to operate as an air lock between the chambers 306 and the remaining areas (for example, the load ports 301 and the wafer orienter 303) of the plasma processing system 300. The load lock modules 304 may be configured to be sealed, evacuated, and vented. In some embodiments, before transferring one of the semiconductors wafers into or out of one of the chambers 306, one of the load lock modules 304 is sealed and evacuated such that the pressure within the one of the load lock modules 304 is equal to the pressure within the chambers 306. Additionally, before the first wafer transfer unit 302 places one of the semiconductor wafers to be processed from the wafer orienter 303 on one of the load lock modules 304 or picks-up a processed one of the semiconductor wafers from one of the load lock modules 304, the one of the load lock modules 304 is vented such that the pressure within the one of the load lock modules 304 is equal to the pressure within the load ports 301 and the wafer orienter 303 of the plasma processing system 300.

The second wafer transfer unit 305 is configured to pick-up and place the semiconductor wafers so as to transport the semiconductor wafers between the load lock modules 304 and the chambers 306. In some embodiments, the second wafer transfer unit 305 may be configured as a robotic arm. However, it should be noted that the second wafer transfer unit 305 may include any suitable mechanism or device for transferring the semiconductor wafers.

The chambers 306 are configured to subject the semiconductor wafers to the plasma treatment process at a relatively low pressure (for example, a pressure below an atmospheric pressure) so as to reduce or eliminate the flow of contaminants from the chambers 306 into other areas of the plasma processing system 300.

Figure 9:
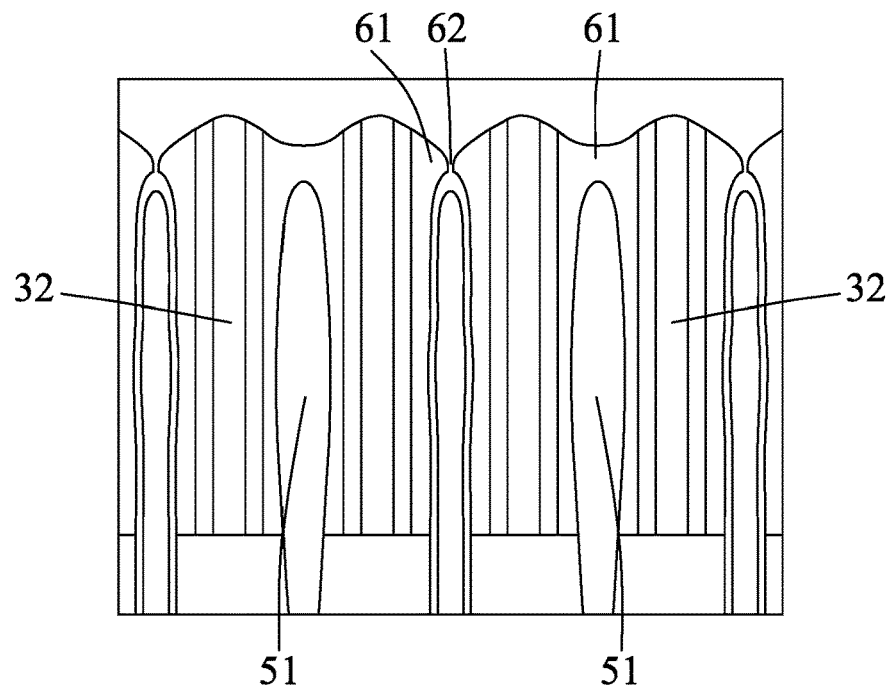
FIGS. 9 and 10 are fragmentary views each illustrating air gaps formed in a semiconductor device at an intermediate stage of the method as depicted in FIG. 1 in accordance with some embodiments.
Figure 10:
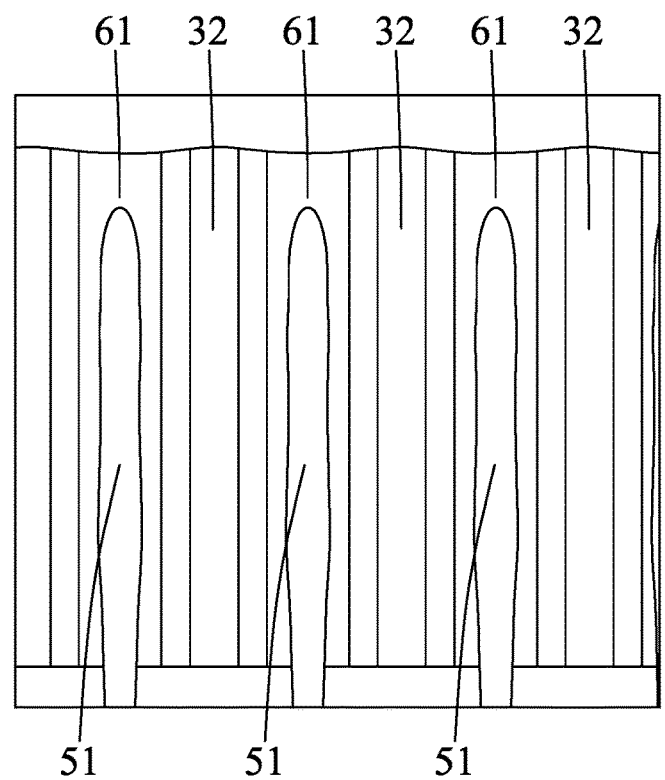

FIG. 9 illustrates a fragmentary view of the semiconductor device 200 shown in FIG. 5 in accordance with the some embodiments in which the plasma treatment process is conducted at a plasma bias power ranging from about 301 W to about 999 W for a time period ranging from about 61 sec to 300 sec. FIG. 10 illustrates a fragmentary view of the semiconductor device 200 shown in FIG. 5 in accordance with the some embodiments in which the plasma treatment process is conducted at a plasma bias power ranging from about 101 W to about 300 W for a time period ranging from about 301 sec to 999 sec. Referring to the configurations shown in FIGS. 9 and 10, the air gaps 51 are formed among the second interconnect features 32 and are capped by the capping portions 61. A seam 62 is formed in at least one of the capping portions 61 of the configuration shown in FIG. 9. In comparison to the plasma bias power and the time period in the plasma treatment process for forming the configuration shown in FIG. 9, the plasma treatment process for forming the configuration shown in FIG. 10 is conducted at a relatively lower plasma bias power for a relatively longer time period, and the capping portions 61 of the configuration shown in FIG. 10 are not formed with the seam 62 found in the capping portions 61 of the configuration shown in FIG. 9, indicating that the configuration shown in FIG. 10 has a seal ratio greater than that of the configuration shown in FIG. 9. The seal ratio is defined as a ratio of the number of the air gaps formed without the seam to the total number of the recesses to be formed into the air gaps.

Figure 7:
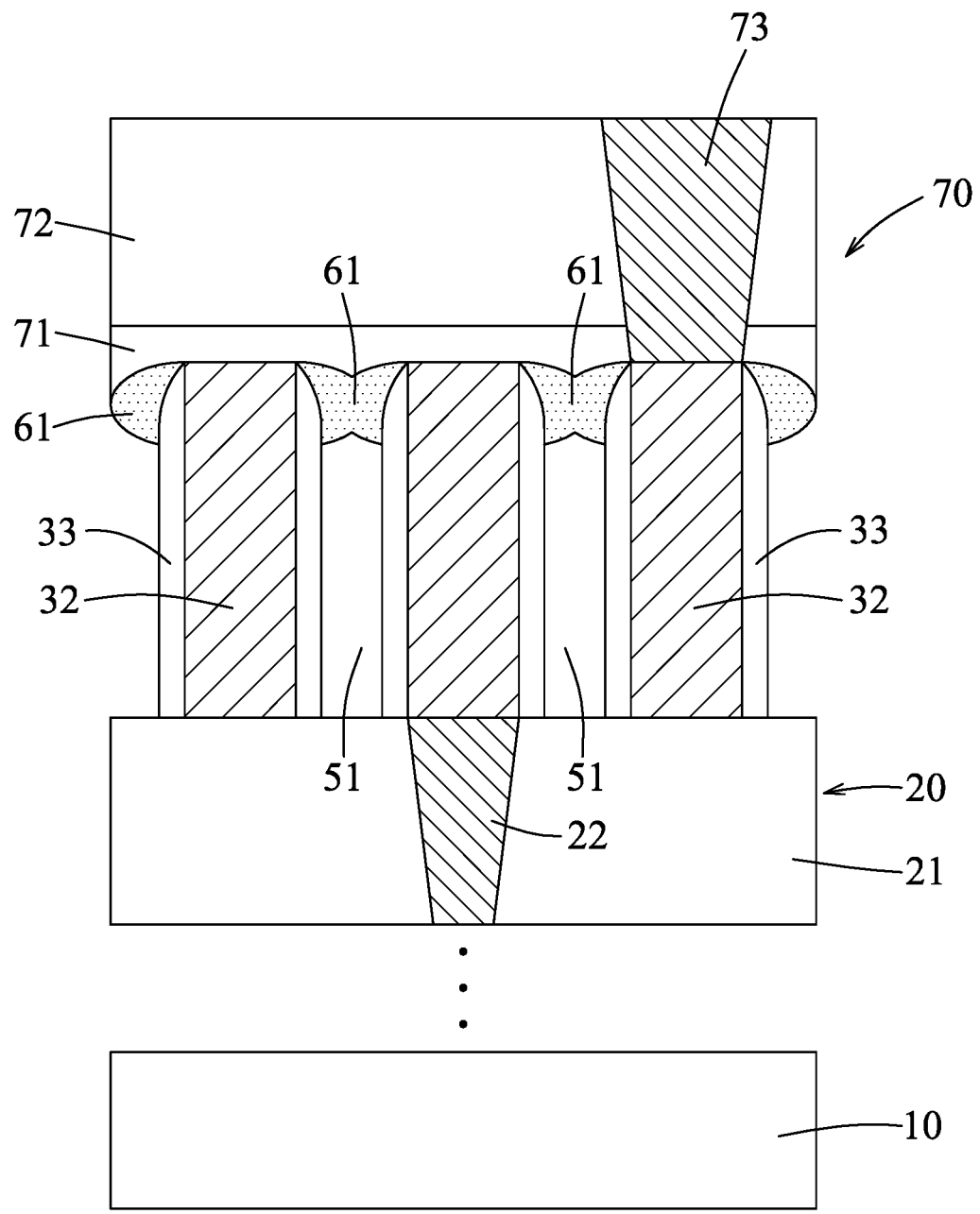

Referring to FIG. 1 and the example illustrated in FIG. 7, the method 100 proceeds to step 105, where a third interconnect layer is formed. FIG. 7 is a schematic view illustrating formation of a third interconnect layer 70 on the capping portions 61 and the second interconnect features 32. The third interconnect layer 70 includes an etch stop layer 71 disposed on the capping portions 61 and the second interconnect features 32, a third ILD layer 72 disposed on the etch stop layer 71, and a third interconnect feature 73 extending through the third ILD layer 72 and the etch stop layer 71 to be electrically connected to a corresponding one of the second interconnect features 32. In some embodiments, the third interconnect layer 70 may serve as a via layer, and third interconnect feature 73 may serve as a conductive via contact to be electrically connected to a corresponding one of the second interconnect features 32. In some embodiments, the etch stop layer 71 may include silicon nitride, silicon nitride doped with carbon, silicon oxide, silicon oxynitride, silicon oxynitride doped with carbon, amorphous carbon material, silicon carbide, silicon oxycarbide, other nitride materials, other carbide materials, aluminum oxide, other metal oxides, aluminum nitride, other metal nitrides (e.g., titanium nitride, or the like), boron nitride, boron carbide, and other low-k dielectric materials or low-k dielectric materials doped with one or more of carbon, nitrogen, and hydrogen, or other suitable materials. Other suitable materials for forming the etch stop layer 71 are within the contemplated scope of the present disclosure. Examples of the material for the third ILD layer 72 may be the same as or similar to those of the material for the first ILD layer 21 described above, and the details thereof are omitted for the sake of brevity. In some embodiments, the third interconnect feature 73 may include a bulk metal region (not shown) and a liner layer (not shown) disposed to separate the bulk metal region from the third ILD layer 71. Examples of the material for the bulk metal region of the third interconnect features 73 may be the same as or similar to those of the material for the bulk metal region of the first interconnect feature 22 described above, and the details thereof are omitted for the sake of brevity. Examples of the materials for the liner layer of the third interconnect features 73 may be the same as or similar to those of the materials for the liner layer of the first interconnect feature 22 described above, and the details thereof are omitted for the sake of brevity. In some embodiments, the third interconnect layer 70 may be formed using a single damascene process.

In a method for manufacturing a semiconductor device of the present disclosure, a patterned mask layer is subjected to a plasma treatment process, such that mask portions of the patterned mask layer are deformed to form a plurality of capping portions to cap a plurality of recesses formed among a plurality of interconnect features so as to form a plurality of air gaps among the interconnect features. The plasma treatment process for forming the air gaps is simple and well-controlled. In addition, the air gaps formed among the interconnect features have the lowest k value (k=1), and thus the line-to-line capacitance and the RC time delay can be effectively reduced.

In accordance with some embodiments of the present disclosure, a method for manufacturing a semiconductor device includes: forming a patterned mask on a patterned structure disposed on a substrate, such that a first mask portion and a second mask portion of the patterned mask are disposed on a first interconnect feature and a second interconnect feature of the patterned structure, respectively; and subjecting the patterned mask to a plasma treatment process such that the first and second mask portions are deformed to form a capping portion to cap a recess disposed between the first and second interconnect features so as to form an air gap.

In accordance with some embodiments of the present disclosure, the plasma treatment process is conducted for a time period ranging from 10 sec to 999 sec.

In accordance with some embodiments of the present disclosure, the plasma treatment process is conducted at a plasma bias power ranging from 10 W to 999 W.

In accordance with some embodiments of the present disclosure, the plasma treatment process is conducted at a plasma pressure ranging from 10 mT to 100 T.

In accordance with some embodiments of the present disclosure, the plasma treatment process is conducted at a temperature ranging from 100° C. to 600° C.

In accordance with some embodiments of the present disclosure, the plasma treatment process is conducted using a gas source to generate plasma ions or radicals, the gas source including nitrogen, argon, helium, oxygen, or combinations thereof.

In accordance with some embodiments of the present disclosure, the plasma ions or radicals are generated at a power ranging from 0.5 kW to 3 kW.

In accordance with some embodiments of the present disclosure, the patterned mask layer includes silicon oxide, silicon nitride, silicon carbide, silicon oxycarbide, silicon oxynitride, silicon carbonitride, silicon oxycarbonitride, tungsten nitride, tungsten carbide, titanium nitride, zirconium oxide, aluminum oxide, yttrium oxide, aluminum oxynitride, hafnium oxide, hafnium zirconium oxide, hafnium silicon oxide, hafnium silicon oxynitride, zirconium silicon oxide, hafnium zirconium silicon oxide, hafnium aluminum oxide, hafnium aluminum nitride, zirconium aluminum oxide, ytterbium oxide, or combinations thereof.

In accordance with some embodiments of the present disclosure, A method for manufacturing a semiconductor device includes: forming a patterned mask on a patterned structure disposed on a substrate, such that a first mask portion and a second mask portion of the patterned mask are disposed on a first interconnect feature and a second interconnect feature of the patterned structure, respectively; and subjecting the patterned mask to a plasma treatment process such that parts of the first and second mask portions are deformed to form a capping portion to cap a recess disposed between the first and second interconnect features so as to form an air gap, and such that remaining parts of the first and second mask portions which remain on the first and second interconnect features are integrated with the capping portion to form a capping layer.

In accordance with some embodiments of the present disclosure, the plasma treatment process is conducted for a time period ranging from 10 sec to 999 sec.

In accordance with some embodiments of the present disclosure, the plasma treatment process is conducted at a plasma bias power ranging from 10 W to 999 W.

In accordance with some embodiments of the present disclosure, the plasma treatment process is conducted at a plasma pressure ranging from 10 mT to 100 T.

In accordance with some embodiments of the present disclosure, the plasma treatment process is conducted at a temperature ranging from 100° C. to 600° C.

In accordance with some embodiments of the present disclosure, the plasma treatment process is conducted using a gas source to generate plasma ions or radicals, the gas source including nitrogen, argon, helium, oxygen, or combinations thereof.

In accordance with some embodiments of the present disclosure, the plasma ions or radicals are generated at a power ranging from 0.5 kW to 3 kW.

In accordance with some embodiments of the present disclosure, the patterned mask layer includes silicon oxide, silicon nitride, silicon carbide, silicon oxycarbide, silicon oxynitride, silicon carbonitride, silicon oxycarbonitride, tungsten nitride, tungsten carbide, titanium nitride, zirconium oxide, aluminum oxide, yttrium oxide, aluminum oxynitride, hafnium oxide, hafnium zirconium oxide, hafnium silicon oxide, hafnium silicon oxynitride, zirconium silicon oxide, hafnium zirconium silicon oxide, hafnium aluminum oxide, hafnium aluminum nitride, zirconium aluminum oxide, ytterbium oxide, or combinations thereof.

In accordance with some embodiments of the present disclosure, a semiconductor device includes a substrate, a patterned structure, and a capping portion. The patterned structure is disposed on the substrate and includes a first interconnect feature and a second interconnect feature spaced apart from each other. The capping portion is disposed to interconnect the first interconnect feature and the second interconnect feature such that an air gap is formed between the first and second interconnect features and below the capping portion.

In accordance with some embodiments of the present disclosure, the capping portion has a thickness ranging from 5 nm to 100 nm.

In accordance with some embodiments of the present disclosure, the capping portion includes silicon oxide, silicon nitride, silicon carbide, silicon oxycarbide, silicon oxynitride, silicon carbonitride, silicon oxycarbonitride, tungsten nitride, tungsten carbide, titanium nitride, zirconium oxide, aluminum oxide, yttrium oxide, aluminum oxynitride, hafnium oxide, hafnium zirconium oxide, hafnium silicon oxide, hafnium silicon oxynitride, zirconium silicon oxide, hafnium zirconium silicon oxide, hafnium aluminum oxide, hafnium aluminum nitride, zirconium aluminum oxide, ytterbium oxide, or combinations thereof.

In accordance with some embodiments of the present disclosure, the semiconductor device further includes a first mask portion and a second mask portion respectively disposed on the first interconnect feature and the second interconnect feature and integrating with the capping portion to form a capping layer.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:
    forming a patterned mask on a patterned structure disposed on a substrate, such that a first mask portion and a second mask portion of the patterned mask are disposed on a first interconnect feature and a second interconnect feature of the patterned structure, respectively; and
    subjecting the patterned mask to a plasma treatment process such that the first mask portion and the second mask portion are deformed to form a capping portion to cap a recess disposed between the first interconnect feature and the second interconnect feature so as to form an air gap.

2. The method according to claim 1, wherein the plasma treatment process is conducted for a time period ranging from 10 sec to 999 sec.

3. The method according to claim 1, wherein the plasma treatment process is conducted at a plasma bias power ranging from 10 W to 999 W.

4. The method according to claim 1, wherein the plasma treatment process is conducted at a plasma pressure ranging from 10 mT to 100 T.

5. The method according to claim 1, wherein the plasma treatment process is conducted at a temperature ranging from 100° C. to 600° C.

6. The method according to claim 1, wherein the plasma treatment process is conducted using a gas source to generate plasma ions or radicals, the gas source including nitrogen, argon, helium, oxygen, or combinations thereof.

7. The method according to claim 6, wherein the plasma ions or radicals are generated at a power ranging from 0.5 kW to 3 kW.

8. The method according to claim 1, wherein the patterned mask layer includes silicon oxide, silicon nitride, silicon carbide, silicon oxycarbide, silicon oxynitride, silicon carbonitride, silicon oxycarbonitride, tungsten nitride, tungsten carbide, titanium nitride, zirconium oxide, aluminum oxide, yttrium oxide, aluminum oxynitride, hafnium oxide, hafnium zirconium oxide, hafnium silicon oxide, hafnium silicon oxynitride, zirconium silicon oxide, hafnium zirconium silicon oxide, hafnium aluminum oxide, hafnium aluminum nitride, zirconium aluminum oxide, ytterbium oxide, or combinations thereof.

9. A method for manufacturing a semiconductor device, comprising:
    forming a patterned mask on a patterned structure disposed on a substrate, such that a first mask portion and a second mask portion of the patterned mask are disposed on a first interconnect feature and a second interconnect feature of the patterned structure, respectively; and
    subjecting the patterned mask to a plasma treatment process such that parts of the first mask portion and the second mask portion are deformed to form a capping portion to cap a recess disposed between the first interconnect feature and the second interconnect feature so as to form an air gap, and such that remaining parts of the first mask portion and the second mask portion which remain on the first interconnect feature and the second interconnect feature are integrated with the capping portion to form a capping layer.

10. The method according to claim 9, wherein the plasma treatment process is conducted for a time period ranging from 10 sec to 999 sec.

11. The method according to claim 9, wherein the plasma treatment process is conducted at a plasma bias power ranging from 10 W to 999 W.

12. The method according to claim 9, wherein the plasma treatment process is conducted at a plasma pressure ranging from 10 mT to 100 T.

13. The method according to claim 9, wherein the plasma treatment process is conducted at a temperature ranging from 100° C. to 600° C.

14. The method according to claim 9, wherein the plasma treatment process is conducted using a gas source to generate plasma ions or radicals, the gas source including nitrogen, argon, helium, oxygen, or combinations thereof.

15. The method according to claim 14, wherein the plasma ions or radicals are generated at a power ranging from 0.5 kW to 3 kW.

16. The method according to claim 9, wherein the patterned mask layer includes silicon oxide, silicon nitride, silicon carbide, silicon oxycarbide, silicon oxynitride, silicon carbonitride, silicon oxycarbonitride, tungsten nitride, tungsten carbide, titanium nitride, zirconium oxide, aluminum oxide, yttrium oxide, aluminum oxynitride, hafnium oxide, hafnium zirconium oxide, hafnium silicon oxide, hafnium silicon oxynitride, zirconium silicon oxide, hafnium zirconium silicon oxide, hafnium aluminum oxide, hafnium aluminum nitride, zirconium aluminum oxide, ytterbium oxide, or combinations thereof.

17. A method for manufacturing a semiconductor device, comprising:
forming a patterned structure on a substrate, the patterned structure including a first interconnect feature and a second interconnect feature spaced apart from each other, and a first spacer and a second spacer laterally covering the first interconnect feature and the second interconnect feature, respectively, so as to form a recess between the first spacer and the second spacer;
forming a patterned mask on the patterned structure, such that a first mask portion and a second mask portion of the patterned mask are disposed on the first interconnect feature and the second interconnect feature, respectively; and
subjecting the patterned mask to a plasma treatment process such that the first mask portion and the second mask portion are deformed to form a capping portion to cap the recess so as to form an air gap.

18. The method according to claim 17, wherein the capping portion is formed to laterally cover an upper portion of the first spacer and an upper portion of the second spacer.

19. The method according to claim 18, wherein the air gap is formed between the first spacer and the second spacer and is covered by the capping portion.

20. The method according to claim 17, wherein a capping layer is formed by the plasma treatment process, the capping layer including the capping portion and remaining parts of the patterned mask which remain on the first interconnect feature and the second interconnect feature and which are integrated with the capping portion.

* * * * *